United States Patent
Fleischman et al.

(10) Patent No.: US 6,321,320 B1
(45) Date of Patent: Nov. 20, 2001

(54) FLEXIBLE AND PROGRAMMABLE BIST ENGINE FOR ON-CHIP MEMORY ARRAY TESTING AND CHARACTERIZATION

(75) Inventors: Jay Fleischman; Jeffery C Brauch; J. Michael Hill, all of Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/183,536

(22) Filed: Oct. 30, 1998

(51) Int. Cl.[7] ................................................ G06F 17/00
(52) U.S. Cl. .................... 711/217; 711/218; 711/219; 711/101; 711/105; 714/9; 714/30; 714/218; 714/219
(58) Field of Search .................... 714/9, 30, 718–743; 711/105, 101, 217, 218, 219

(56) References Cited

U.S. PATENT DOCUMENTS

| | | | | |
|---|---|---|---|---|
| 4,433,413 | * | 2/1984 | Fasang | 714/9 |
| 4,903,266 | * | 2/1990 | Hack | 714/719 |
| 5,101,409 | * | 3/1992 | Hack | 714/720 |
| 5,469,445 | * | 11/1995 | Nicolaidis | 714/726 |
| 5,557,619 | * | 9/1996 | Rapoport | 714/733 |
| 5,572,712 | * | 11/1996 | Jamal | 395/500.19 |

* cited by examiner

Primary Examiner—Than Nguyen (57) ABSTRACT

A highly flexible and complex BIST engine provides at-speed access, testing, characterization, and monitoring of on-chip memory arrays, independent of other chip circuitry such as a CPU core. Each BIST engine has a main control block, at least one address generation block having an address local control block and one or more address-data generation blocks, and at least one data generation block having a data local control block and one or more data generation blocks. Each of the local address and data control blocks are programmed independently to define operations that will be performed by the individual address and data generation blocks, respectively. The main control block in turn controls operation of the local address and data control blocks to effect desired testing, accessing, and monitoring of the on-chip memory arrays.

92 Claims, 6 Drawing Sheets

MAIN BIST CONTROL REGISTER

FLEXIBLE AND PROGRAMMABLE BIST ENGINE FOR ON-CHIP MEMORY ARRAY TESTING AND CHARACTERIZATION

CROSS REFERENCES TO RELATED APPLICATIONS

The subject matter of the present application is related to copending U.S. application, Ser. No. 09/183,173, titled "Flexible Control of BIST Registers Based upon On-chip Events", filed Oct. 30, 1998, assigned to the assignee hereof and herein incorporated by reference.

FIELD OF THE INVENTION

The present invention relates generally to testing of memory arrays and, more particularly, to an improved, programmable BIST engine capable of testing and monitoring on-chip memory arrays of an integrated circuit device.

BACKGROUND OF THE INVENTION

As memory arrays have become faster and smaller, the trend has been to place such high-speed arrays on-chip. Consider, for instance, computer systems. Until quite recently, memory, an integral part of any computer system, has been located on integrated circuit (IC) devices separate from the central processing unit (CPU) of the computer system. Communication between the CPU and separate memory devices was accomplished by porting the inputs and outputs of the memory arrays to package pins of the memory devices to the CPA via address and data busses. As IC fabrication technology has evolved to the sub-micron level, as evidenced by devices fabricated using a 0.25-micron or even smaller fabrication process, it has become possible to place large memory arrays, such as random access memories (RAMs), static random access memories (SRAMs), and cache RAMs, entirely on-chip with other circuitry, such as a CPU. On-chip memory arrays provide the advantage of direct communication with the CPU without the need for I/Os to external pins.

In spite of the advantages of placing memory arrays on-chip, there are concerns with how to accomplish testing of such on-chip arrays. On-chip memory arrays, which may account for a large portion, even a majority, of the total die area of a chip, are much harder to control and observe than their discrete predecessors, making it difficult to use traditional external tester equipment and hardware to test, screen, characterize, and monitor on-chip arrays. Visibility into how on-chip memory arrays function is severely limited by the placement of the array-chip interface, such as the interface between a memory array and a CPU core of a microprocessor chip, for instance, on-chip.

Figure 1:
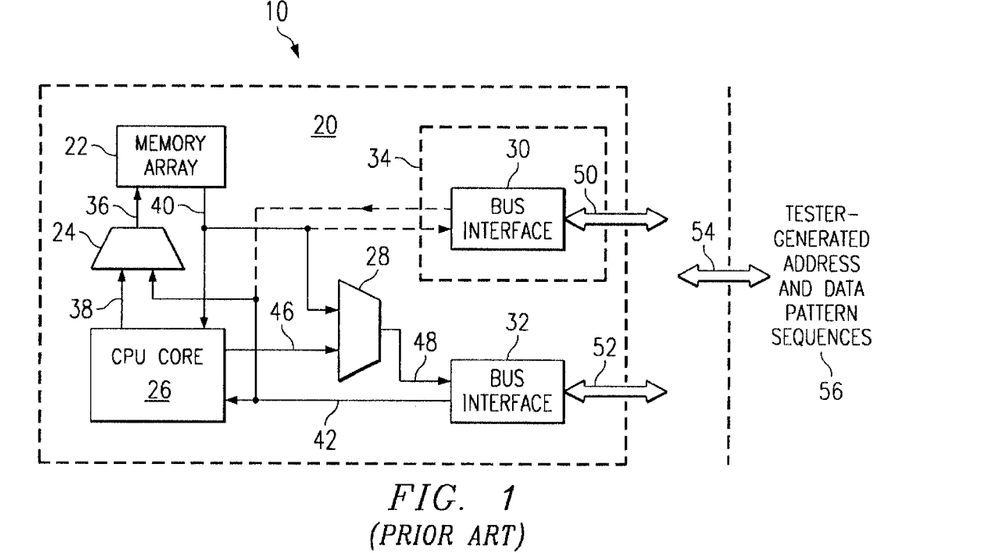
FIG. 1 illustrates a block diagram of direct access testing (DAT), according to the prior art.

Prior methodologies for testing on-chip memory arrays include both Built-In-Self-Test (BIST) and Direct Access Testing (DAT). DAT involves porting the memory array I/Os off the chip in order to engage in direct testing of the array, in a manner similar to testing a discrete memory array device. An example of a prior art DAT implementation 10 is shown in FIG. 1. In this figure, the chip is shown as a microprocessor 20 having on-chip memory array 22, multiplexers (mux) 24 and 28, and central processing unit (CPU) core 26. Data is provided to memory array 22 from either high-performance tester hardware that is external to the microprocessor and capable of providing address and data pattern sequences 56 at high speed and large bandwidth for at-speed testing or directly from the CPU core 26. Datapath control of the memory array 22 is therefore provided by multiplexer 24 that provides information 36 to memory array 22 upon selecting information 38 from CPU core 26 or information 42 from the bus interface 30, 50 or 32, 52. Multiplexers 24 and 28 bus interface 34, and portions of 40, 42 represent special DAT hardware and signals in the memory array datapath. As shown in FIG. 1, DAT I/O interface is provided through bus interface 32 and shared DAT/CPU high-speed chip I/O 52 or, optionally, as indicated by the dashed lines, through DAT I/O interface 34 comprised of bus interface 30 and dedicated DAT high-speed chip I/O 50. Multiplexer 28 chooses information from either bus 40 or bus 46 to present to bus interface 32 via bus 48, as shown. Shared DAT/CPU I/O bus 52 is a microprocessor system bus, such as a cache system bus, that is already available. Data from memory array 22 is provided to CPU core 26 and to either bus interface 30 or 32 via cache address and data busses 40, as shown.

The DAT solution provides the power and flexibility of today's testing equipment but requires more expensive and complex external test support, high-speed I/O for at-speed testing, and additional circuitry and busses than would otherwise be available on the chip in order to properly test and characterize the arrays. For instance, a large memory array that resides on a microprocessor chip, such as a large double- or quad-word accessible cache, would require a large number of external I/O pins or pads of the chip. Additionally, DAT methodologies typically rely upon additional core VLSI datapaths and are thus more dependent on the non-array VLSI.

DAT is also severely challenged by today's high-speed on-chip memory arrays, with frequencies of up to 1 GHz, which typically are much faster than currently available tester technology. A large amount of data must often be presented to the cache of a microprocessor at high speeds, for instance, in order to achieve acceptable fault coverage of the memory. Due to this growing speed discrepancy between on-chip memory arrays and currently available external tester equipment used to test them, the DAT methodology is often no longer capable of testing on-chip memory arrays at speed; it is often necessary to test each array on the chip sequentially or with common test vectors, such as array address and data pattern sequences. Moreover, even as external test equipment can be expected to become faster, memory arrays will themselves also become faster so that this speed discrepancy will continue to be a problem in the future.

Figure 2:
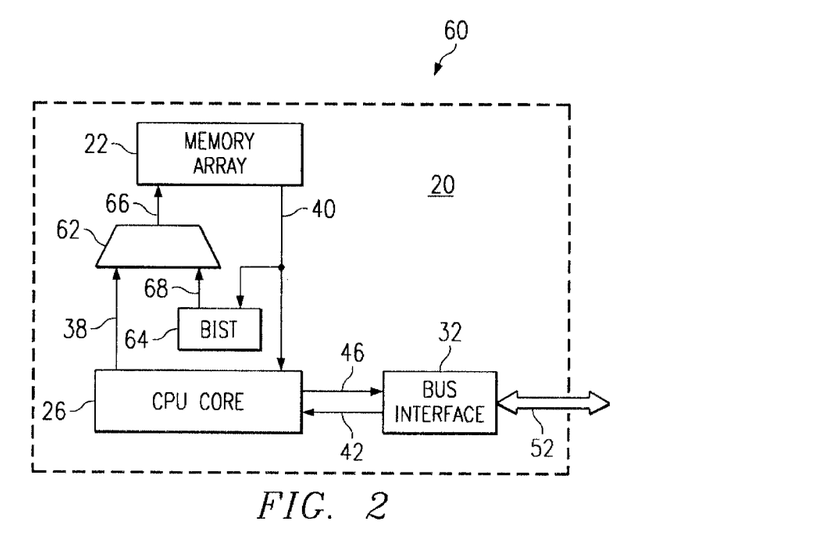
FIG. 2 illustrates a block diagram of a built-in-self-test (BIST) implementation.

BIST differs from DAT in that it essentially integrates the test vector generation provided by the external tester equipment of DAT on-chip. Referring to FIG. 2, a BIST implementation is illustrated. BIST moves the test vector generation on-chip microprocessor 20 inside BIST block 64 so that less hardware is required of the BIST implementation than a DAT implementation. Multiplexer 62, BIST block 64, portions of bus 40, and associated address/data bus 68 represent special BIST hardware in the memory datapath. Previous BIST solutions predominantly hard-wired the test vector generation within BIST block 64 to render only limited, fixed test functionality. In order to provide independent, although restricted, access to just the memory array(s) 22, as opposed to accessing the entire chip 20, BIST operation and extraction of test results are typically accomplished through IEEE Standard 1149.1 Joint Test Action Group (JTAG) boundary scan Test Access Port (TAP).

What is lacking in the prior art, therefore, is the ability to directly access, test, and monitor on-chip memory arrays in a flexible, thorough manner. Flexibility in test vector generation is particularly essential for testing large, on-chip arrays because it is often impossible to accurately predict critical sensitivities of such arrays. Whether an array passes or fails a given test is dependent upon many interrelated factors, including the voltage to which the array is subjected, the testing temperature, the fabrication process of the array, and the frequency or frequencies at which the array is tested. Large, high-density memory arrays are also notoriously susceptible to various electrical and coupling effects, such as cell-to-cell coupling, bitline coupling, and ground bounce, that may cause logic and timing failures of the array. Moreover, the large number of sub-micron transistors of large, high-density arrays have known possible manufacturing defects, such as particle contamination, missing p-wells, and open/short conditions, for which the arrays must be tested.

SUMMARY OF THE INVENTION

It is therefore an object of the present invention to be able to test large, on-chip memory arrays of an integrated circuit chip device in a flexible and through manner.

It is further an object of the present invention that such on-chip memory arrays be able to be easily accessed and monitored.

Therefore, according to the present invention, a structure and methodology of the present invention satisfies these objectives by providing programmable, at-speed on-chip testing, access, and monitoring of one or more on-chip memory arrays. A BIST engine resides on-chip between the on-chip memory arrays and other chip circuitry, such as a CPU of a microprocessor and operates to provide flexible testing and monitoring while eliminating the need for external testing resources. The on-chip memory arrays need not be the same size in order to be tested by the BIST engine. Additionally, multiple BIST engines may be employed on a chip.

Each BIST engine has a main control block, one or more address generation blocks, and one or more data generation blocks. The main control block controls operation of the address generation blocks and the data generation blocks through its main control register. The address generation blocks operate to selectively provide address information to the on-chip memory arrays and include an address local control block having an address control register and one or more address-data blocks. The address-data blocks have address-data registers that are controlled by the address control register to provide address information to the on-chip memory arrays from either the one or more address generation blocks, or from other on-chip non-BIST engine, non-memory array circuitry of the integrated circuit device such as a CPU, in accordance with instructions programmed into the address control register. The address control register may also be programmed to control the address-data registers to monitor address information provided to the on-chip memory arrays from either the one or more address generation blocks or from other on-chip non-BIST engine circuitry like the CPU.

Similarly, the data generation blocks operate to selectively provide and receive data information to and from the one or more on-chip memory arrays and include a data local control block having a data control register and one or more data-data blocks. The data-data blocks have data-data registers controlled by the data control register to provide or monitor data information from either the one or more data generation block or on-chip non-BIST engine circuitry of the integrated circuit device, such as the CPU, to the on-chip memory arrays in accordance with instructions programmed into the data control register and to receive information from the memory arrays. The main control register of the main control block coordinates when the address generation blocks and the data generation blocks execute their programming and can also ensure that the BIST engine operates synchronously with the non-BIST engine circuitry of the integrated circuit chip.

According to the method of the present invention, the address generation blocks and the data generation blocks of the BIST engine are programmed to provide address and data information to the on-chip memory arrays and to receive data information from the memory arrays in order to facilitate monitoring of the memory arrays. Programming the address and data generation blocks is accomplished by programming the appropriate control registers of the local address and data local control blocks to control the address and data generation blocks in the manner desired. The main control block is then programmed to coordinate execution by the address and data generation blocks of their programming; the main control block also ensures that the BIST engine operates synchronously with the CPU of the chip.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

The present invention improves upon previous BIST design and methodology by adapting desirable features characteristic of DAT external testers for high-speed on-chip memory array structures. At-speed, flexible on-chip testing of the memory arrays is provided, an advantage not typically offered by DAT because of the large bandwidth required by today's on-chip memory arrays. The DAT requirement for external tester equipment to test the memory array is thereby eliminated, obviating the need for expensive external test resources. The present invention provides full access to, and monitoring of, on-chip memory arrays as well.

The BIST engine resides at the interface between the memory array and other non-BIST engine circuitry, such as CPU core logic, as shown in FIG. 2. Control of the BIST engine is accomplished through several physically separate local control blocks, called address local control blocks (ALCs) and data local control blocks (DLCs), of address generation blocks (AGBs) and data generation blocks (DGBs), respectively, that are in turn controlled by one BIST main or global control block (BMC), with each local control block having its own instruction control register to control the operation of one or more associated data registers. Flexibility in test vector generation is provided by programming the BIST engine through privileged CPU read and write instructions, or through a dedicated interface to the BMC like a serial JTAG TAP interface. A distributed programming model is used for the BIST engine to reduce the number of signals and simplify the control logic required for test vector generation. All programming of the BIST engine is therefore accomplished through reading and writing to and from various BIST registers within the BIST engine, whether via the interface from the BMC to the AGBs and DGBs or by interfacing with the CPU.

A BIST program is generated by independently programming each of the local control blocks to define the operations to take place in the individual data blocks controlled by the local control blocks. The term "independently" is meant to denote that the ALC and DCL local control blocks may be programmed to perform unrelated functions and may be programmed separately, independently, and in any order with respect to each other; the ALC blocks do not necessarily have to be programmed prior to the DLC blocks, for instance. After the local control blocks are programmed, the BMC is then programmed by either the dedicated interface to the BMC, shown as 122 of FIG. 3, or by the CPU and is used to coordinate when the local control blocks are to start and stop executing their programmed instructions and to provide an interface to the CPU core. If desired, the BMC can be programmed by privileged CPU instructions to ensure that BIST engine operation is launched synchronously with the CPU core of the integrated circuit chip. If the BMC is programmed by dedicated interface 122 it would operate independently of the other, non-BIST engine and non-memory array circuitry of the chip, such as the CPU core, thereby allowing the BIST engine and on-chip memory arrays to be tested and monitored even when the CPU core is down.

The BIST engine is programmed using a remote diagnose register (RDR) approach or other programming methodology. In the case of RDR programming, all BIST registers utilize a staging register that provides non-destructive reads and single-cycle updates for RDR writes, even for registers, such as multiple-input-shift-registers (MISRs), that require multiple diagnose shift operations. In this manner, non-intrusive read or write access is available for all address and data patterns, signature analysis MISR registers, redundancy registers, and control for local programming of the AGB and DGB blocks.

Figure 3:
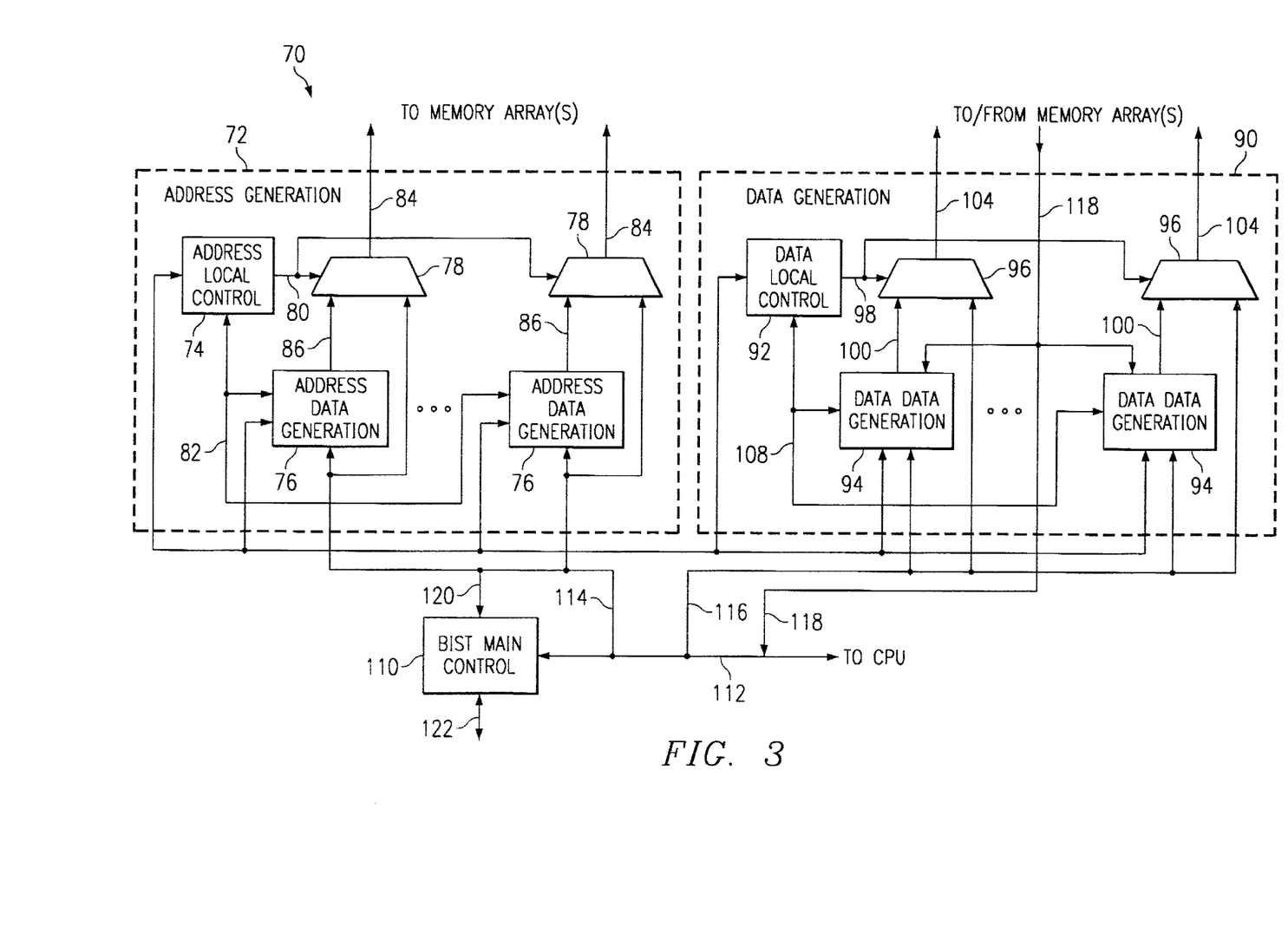
FIG. 3 illustrates a high-level block diagram of a BIST engine, according to the present invention.
Figure 9:
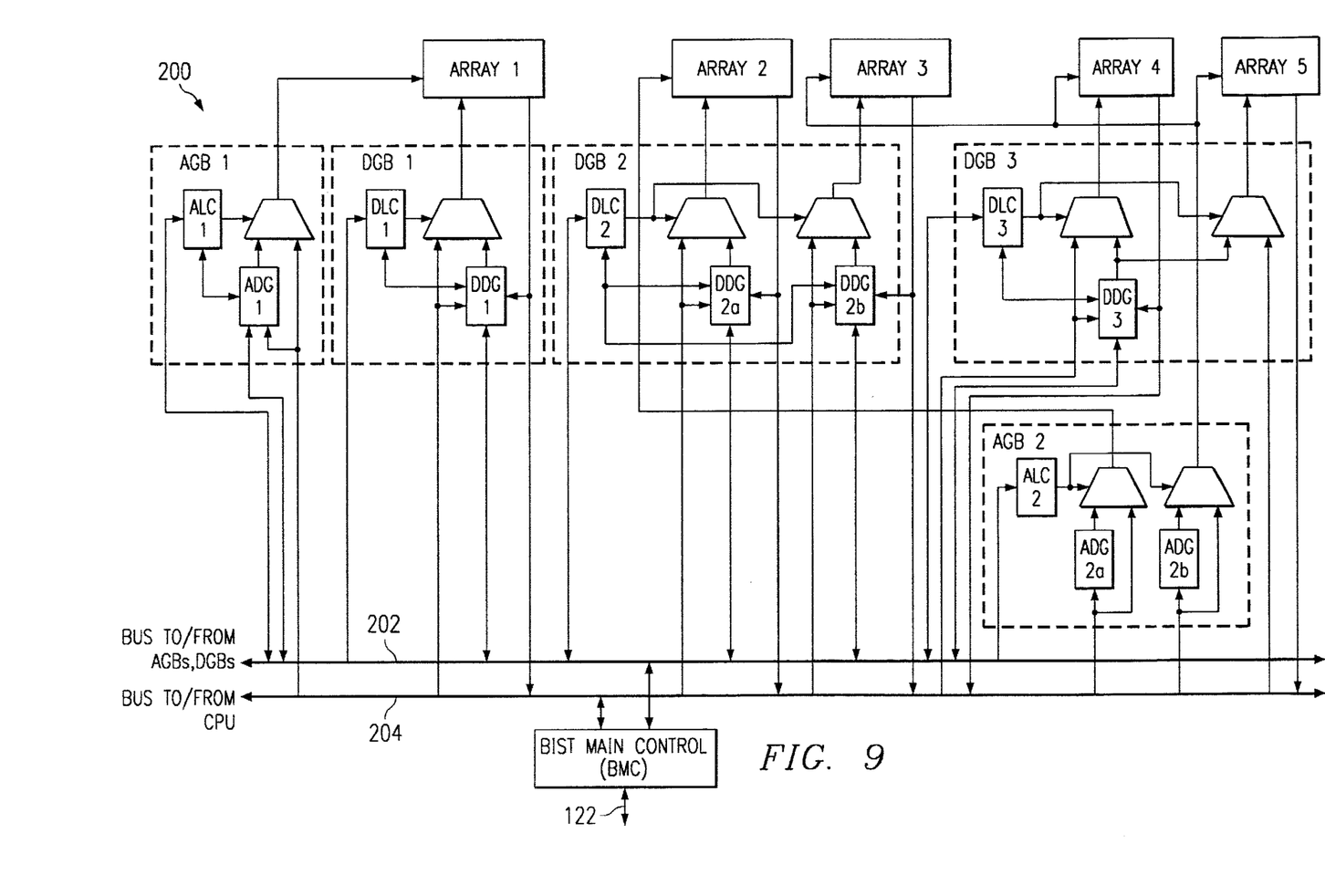
FIG. 9 illustrates several possible implementations of a BIST engine, according to the present invention.

Referring now to FIG. 3, a high-level block diagram of a BIST engine 70 according to the present invention is shown. This figure represents the most basic BIST engine configuration; FIG. 9 expands upon FIG. 3 by showing various possible BIST engine configurations that are in keeping with the basic configuration of FIG. 3. As shown in FIG. 3, each BIST engine 70 according to the present invention has one BIST main control block (BMC) 110, at least one address generation block (AGB) 72 having one address local control block (ALC) 74 and one or more address-data generation blocks (ADG) 76, and at least one data generation block (DGB) 90 having one data local control block (DLC) 92 and one or more data-data generation blocks (DDG) 94. Each of the local control blocks ALC 74 and DLC 92 is independently programmed to define the operations that will be performed by the individual data blocks 76 and 94, respectively. BMC 110 is then programmed, via dedicated interface 122 or by the CPU over bus 112, to coordinate the operation of the local control blocks ALC 74, DLC 92 and to communicate with the rest of the on-chip circuitry; herein lies the flexibility of the invention. Logic inside BMC 110 selects either interface 112 or 122. Dedicated interface 112 may be any interface, either serial or parallel; a serial interface, such as the JTAG TAP serial interface, is an inexpensive and reliable choice.

Each AGB 72 of the BIST engine has ALC block 74 that controls the operations of the one or more individual data blocks ADG 76 via bus 82. BMC 110 may receive privileged CPU instructions from the CPU via bus 112 that are provided to ALC block 74 to control the ADG blocks 76. ALC 74 controls the multiplexer 78 associated with each ADG block 76 via bus 80 to chose address data from ADG block 76 on bus 86 or directly from the CPU on bus 114. Array address bus 84 provides the generated address data to one or more on-chip memory arrays. Similarly, each DGB 90 of a BIST engine has one DLC block 92 that controls one or more DDG blocks 94 via bus 108 to allow parallel access and monitoring capabilities simultaneously to all on-chip memory arrays connected to the BIST engine 70. DLC block 92, via bus 98 to the one or more multiplexers 96, decides whether to provide data from the one or more DDG blocks 100 or from the CPU via bus 116 to one or more on-chip memory arrays on bus 104. Multiplexer(s) 96 accordingly provide data from DGB 90 to the one or more arrays. Unlike AGB 72, the one or more DDG blocks 94 of DGB 90 additionally receive data from the one or more on-chip memory arrays via bus 118; Bus 118 additionally provides this data to the CPU.

Each AGB 72 has an address control register and a queue consisting of general-purpose and special-purpose address-data registers. ALC 74 has the address control register and each ADG 76 contains the general- and special-purpose registers. ALC 74 is programmed through the address control register that dictates how the data registers of one or more ADG blocks 76 source addresses (bus 86) to the one or more memory arrays or monitor the CPU-generated addresses of bus 114.

ADGs 76 contain the address queue consisting of address-data registers that are each at least as wide as the array's address and that are programmed to source or monitor addresses to the on-chip memory arrays and are connected to apply sequences of addresses to the on-chip memory arrays without involving the CPU in any way. Some of the data registers are special-purpose registers, such as a multiple-input-shift-register (MISR), counters and linear feedback shift registers (LFSRs), that may be selectively disabled to operate as general-purpose registers if desired.

The MISR is capable of performing signature analysis by recording and compressing a sequence of CPU-issued or BIST engine-generated addresses. The MISR compresses a data sequence on a bus into a single "signature" through a process of XORing and shifting new data with current data. The resulting digital signature is nearly unique for a given data sequence over time. This signature is used to identify an error or fault. If an error or fault occurs, the signature will not match the expected value. The signature analysis methodology is especially useful for performing extended memory array characterization using random sequences and for monitoring the critical memory array-CPU core interface 112 during CPU core testing.

Figure 4:
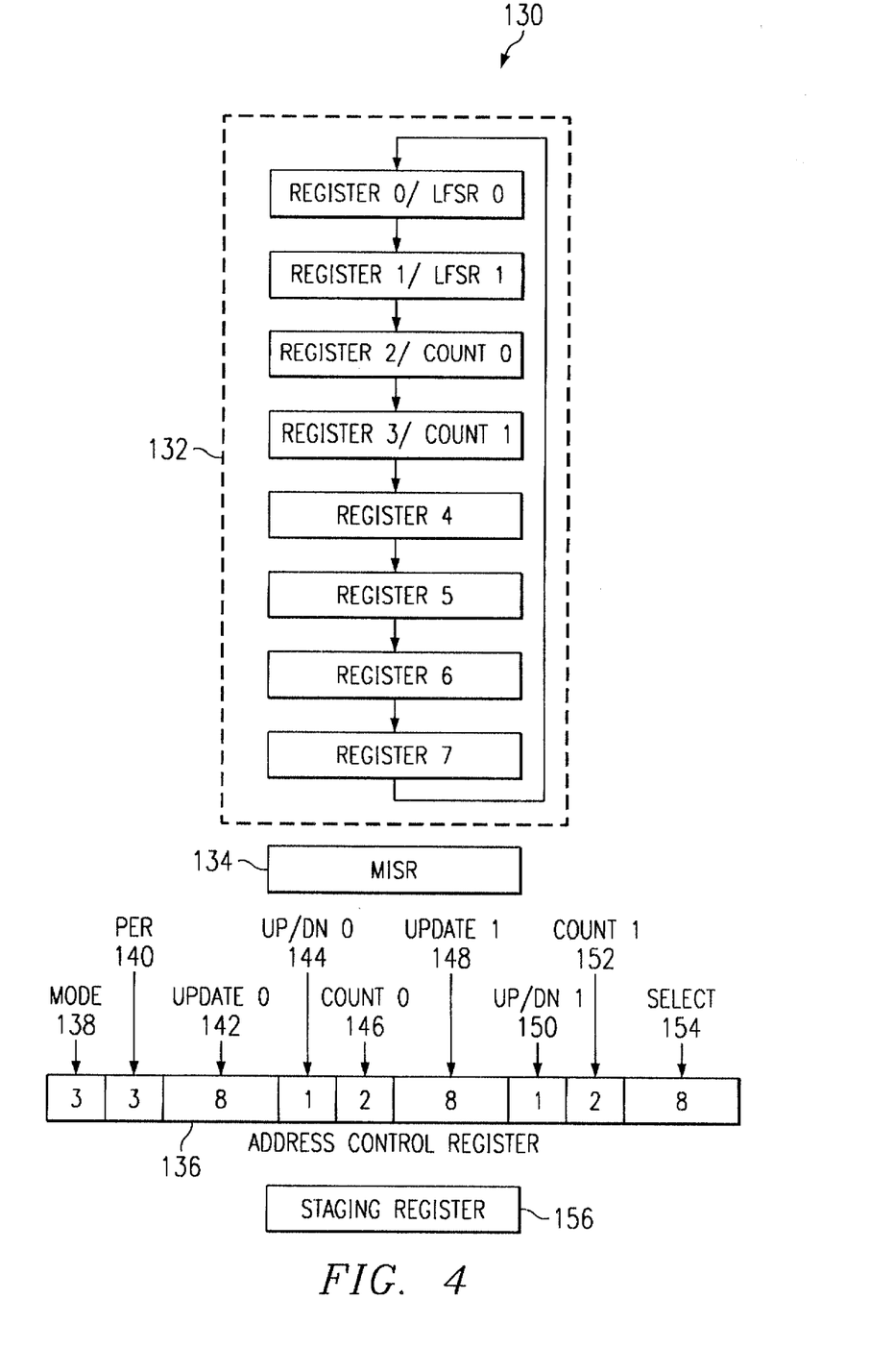
FIG. 4 illustrates an address generation block, according to the present invention.

FIG. 4 provides an example of how a sample address generation block might be configured. In this example, the address block of AGB 72 is shown as having eight address-data registers 132, MISR 134, and address control register 136. Four of the eight registers 132 are special purpose registers; Register 0 is a first LFSR register, Register 1 is a second LFSR register, Register 2 is a first counter register, and Register 3 is a second counter register. One will recognize that any number or type of special function registers may be used in the address block. All of the registers shown in FIG. 4 utilize staging register 156 to program them.

Address control register 136 is 36 bits long in this example and is made up of several fields that both determine the mode of operation of the address block 72 as a whole and control the operation of the individual special function registers: LFSR 0, LFSR 1, Count 0, Count 1. The first field 138 of address control register 136 is the mode of AGB 72, made up of three control bits in this example. There are several types of modes appropriate to an address block, including the following: generate addresses from a single register of registers 132, generate addresses by ping-ponging between two registers of registers 132, generate addresses by looping through some or all of the eight registers 132, and record addresses arriving from the CPU via bus 114 in registers 132 or MISR 134. The last mode of recording addresses from the CPU is used to test functionality outside the memory array.

In addition to the mode field, it can be seen that there are various fields 142, 144, 146, 148, 150, and 152, of address control register 136 that allow control of the special function registers of this example. For the LFSR 0, LFSR 1, Count 0, and Count 1 registers, these fields control the following functions: enable special counting modes or disable counting so that the LFSR and counter registers behave as general purpose registers (fields 146, 152), increment or decrement counting (fields 144,150), independently control each special function register (fields 142, 148), and control when each special function register is updated (fields 142,148).

Figure 5:
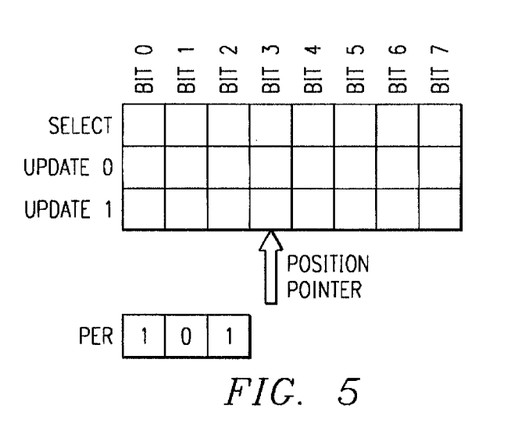
FIG. 5 illustrates an example of updating a special function register, according to the present invention.

FIG. 5 illustrates an example of how updating a special function register might be controlled. The position pointer is initialized to index zero and is then incremented each clock cycle. If the bit in the update field indicated by the position pointer is a high logic state ("1"), then the special function register that is associated with that update field is updated. The period field ("per") 140 controls the number of clock cycles that occur before the position pointer returns to index zero and repeats the above-described sequence. In this example, the maximum sequence length is eight.

The source of the memory address at each clock cycle is determined by the mode field 138 and the select field 154. The mode field 138 designates the registers as potential sources of the memory address to the one or more on-chip memory arrays. For instance, mode 0 selects the LFSR 0 and LFSR 1 registers, mode 1 selects the LFSR 0 and Count 1 registers, and mode 2 selects the two counters registers Count 0 and Count 1. The select field 154, also eight bits wide in this example, chooses between the two registers designated as potential address sources by the mode field 138 and is indexed by the position pointer shown and described in conjunction with FIG. 5, above.

Data Generation Block 90 is similar to AGB 72 in that it also consists of a data control register, data registers and a MISR. It additionally consists of a read/write register and compare logic. It is noted that the read/write register could alternatively be located in AGB 72. The data control register is contained within DLC block 92 while the other registers and logic are contained within each DDG block 94. The data block dictates how the one or more DDG blocks 94 source data values to the on-chip memory arrays or monitor CPU- or memory array-generated values.

Like the AGB, DLC block 92 of DGB 90 is programmed through the data control register that determines whether the one or more DDG blocks 94 source the data presented to the one or more on-chip memory arrays via busses 104 or simply monitors the CPU- or memory array-generated data via buses 116 and 118, as shown. Each DDG 94 contains registers used to source or monitor data values. The DDG registers can be connected to form a data queue that applies sequences of data, of any size, to the one or more memory arrays without involving the CPU, if desired. These registers, some of which are special function registers that can be selectively disabled to operate as general registers, can be accessed through CPU instructions.

The MISR of DGB 90 operates in much the same way as the MISR of AGB 72 described above. It is typically the same length as the other data registers of DGB 90 and could monitor both read and write data. The MISR records and compresses data coming out of the memory array(s). When enabled, the MISR register can be checked after a test has been performed to determine whether a failure occurred during that test.

Figure 6:
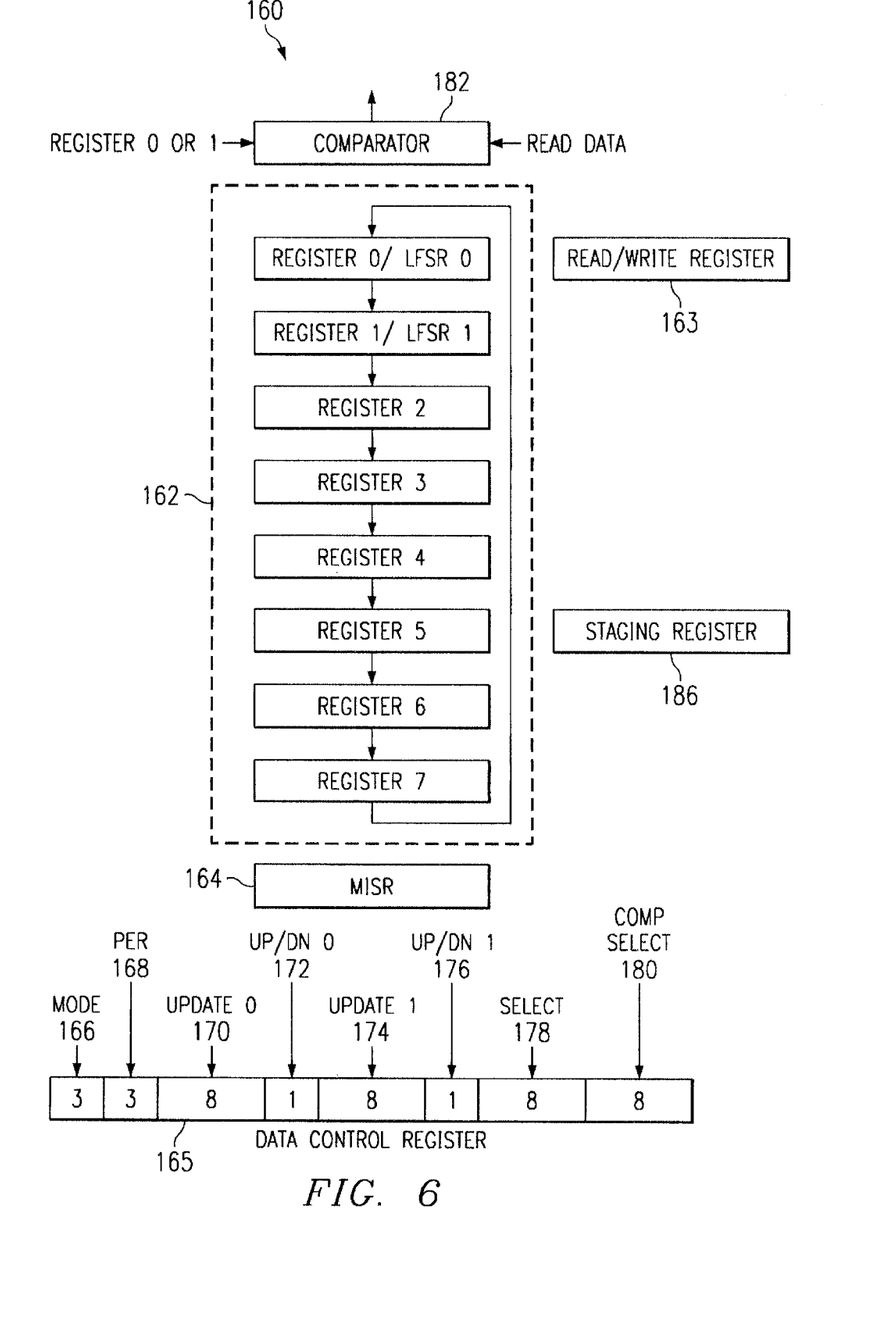
FIG. 6 illustrates a data generation block, according to the present invention.

FIG. 6 provides an example of how a sample data generation block might be configured. In this example, the data block of DGB 90 is shown as having eight registers 162, read/write register 163, MISR 164, data control register 165, and comparator 182. Two of the eight registers 162 are special purpose registers; Register 0 is a first LFSR register and Register 1 is a second LFSR register. LFSR 0 and LSFR 1 are special function registers that can function as reversible LSFRs or as inputs to comparator 182, as shown. One will recognize that any number of registers or types of special function registers may be used in the data block. In this example, data registers 162, MISR 164, and comparator 182 are each as wide as the memory array to which they are coupled. All of the registers shown in FIG. 6 utilize staging register 186 to program them.

Like address control register 136, data control register 165 of DLC 92 directs the operation of the general- and special-purpose data registers of the DDG blocks 94. In this example, data control register 165 is 40 bits long and is made up of several fields that both determine the mode of operation of the DGB 90 as a whole and control the operation of the individual special function registers: LFSR 0 and LFSR 1. The first field 166 of address control register 165 is the mode of DGB 90, made up of three control bits in this example. There are several types of modes appropriate to a data block, including the following: generate data by ping-ponging between two registers of registers 162, generate data by looping through some or all of the eight registers 162, record data read out of the memory array in the registers 162 or MISR 164 so that the memory array as well as the CPU is tested, or some combination of the first two modes in which data from DGB 90 is written to the memory array and data read out of the memory array is saved. In this combination mode, the data registers 162 are configured like a first-in-first-out (FIFO) device with read data entering the FIFO as write data is exiting.

In addition to the mode field, data control register 165 contains fields 170, 172, 174, 176, 178, and 180 that control the following functions: disable counting so that the LFSR registers are treated as general purpose registers and control when each special function register is updated (fields 170, 174), increment or decrement the LFSRs (fields 172, 176), and use the value of a special function register as an input to comparator 182 (field 180). A combination of the select field 178 and mode field 166 determines which register is used to source data to the on-chip memory arrays.

The read/write register 163, like the update and select fields, is eight bits long and may be indexed by the position pointer shown in FIG. 5 above. Each bit of the read/write register is a read/write bit that determines whether a read or a write operation from/to the memory array will be performed when that bit is referenced by the position pointer.

The special function registers in the data block are selected and updated in the same manner as the special function registers of the address block. MISR 164 monitors both read and write data, and may be implemented to prioritize write data monitoring over read data monitoring and to monitor the write data bus on cycles when neither write nor read data are valid. During all BIST engine operations, the BIST write-enable patterns are used to determine MISR updates, as will be described below in conjunction with the discussion on BMC 110, that only occur during BIST engine operations. CPU-generated write-enable patterns can be used to determine MISR updates when it is desired to monitor the CPU. Comparator select field 180 determines the source of one of two comparator inputs-LFSR 0 or LFSR 1; the other comparator input is provided by the data that has just been read from the array. The fields of data control register 165, then, allow data just read from the array to be immediately compared to an expected value stored in the selected LFSR.

As previously mentioned, BMC 110 controls when all local control blocks ALC 74 and DLC 92 start and stop their programmed operations. BMC 110 also coordinates the MISR updates, provides an interface to on-chip debug hardware for sampling/monitoring the address and data busses, and controls the signature analysis provided by the MISRs of the ADG blocks 76 and the DDG blocks 94. The bit-compare results generated by the compare logic 182, 184 of DDG blocks 94 are received by BMC 110 which can cause the current operations by the ADG blocks 76 and the DDG blocks 94 to be aborted or paused through proper control of the local control blocks ALC 74 and DLC 92, respectively.

The BIST engine program execution is initiated when an instruction is stored into the main control instruction register of the BMC 110. Programming of the main control instruction register of BMC 110 launches the BIST engine operation synchronously with the CPU core, when BMC 110 is programmed with CPU privileged instructions, so that read and write operations of the other BIST registers contained within AGB 72 and DGB 90 does not initiate BIST operations. Alternately, programming BMC 110 via dedicated JTAG TAP interface 122 provides for operation of the BIST engine and memory arrays independently of the CPU. The synchronized BIST engine/CPU interface is further reflected in that BIST engine operation appears as an extended diagnose shift operation to the CPU. CPU-generated memory array access requests are generally ignored during BIST operations. When the BIST operation is complete, the instruction retires.

Figure 7:
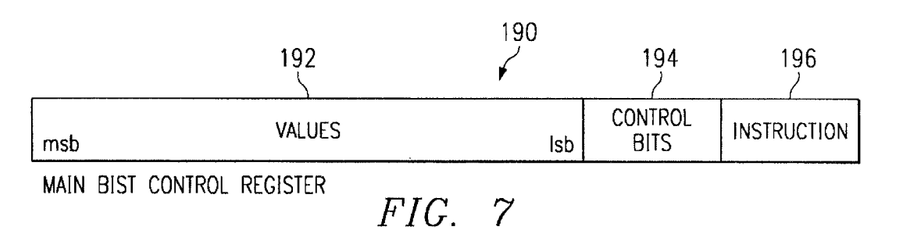
FIG. 7 illustrates a main BIST control instruction register, according to the present invention.

Referring now to FIG. 7, an example of how the main BIST control instruction register 190 of BMC 110 might be configured is illustrated. Field 192 contains a predetermined number of bits representative of data. Field 194 contains control bits and field 196 contains the instruction to be programmed into the control register 190. All of the instructions 196 that are stored in control instruction register 190 require that programming of local control blocks 74 and 92 must occur before control instruction register 190 can initiate BIST engine operation.

There are many types of control bits that might be stored in field 194. The following are but a few of the types of control that might be required of the main BIST control instruction register 190 and, of course, other types of control bits might be added as required. A MISR enable control bit would enable the signature analysis performed by MISR registers 134 and 164. A MISR start/stop bit would control when updates of MISR registers 134 and 164 are started and stopped. A parity control bit would stop the BIST program in the event of any parity error. The system designer has the flexibility to include any controls bits that might be relevant to a particular BIST engine environment.

The bits of field 196 represent the various instructions that may be programmed into the BIST engine 70. Examples of relevant instructions include the following: an instruction to clear write enables of AGB 72 and DGB 90 by forcing them to a write condition and then executing the local program for a given number of clock cycles, an instruction to execute the local BIST program of AGB 72 and DGB 90 for the given number of clock cycles and while performing MISR update operations, an instruction to execute local BIST programs until a new instruction 196 is issued to AGB 72 and DGB 90-this instruction is useful for monitoring and debugging the memory array being tested, and a null instruction to stop all local BIST programs and to also enable and start/stop MISR update operations.

Figure 8:
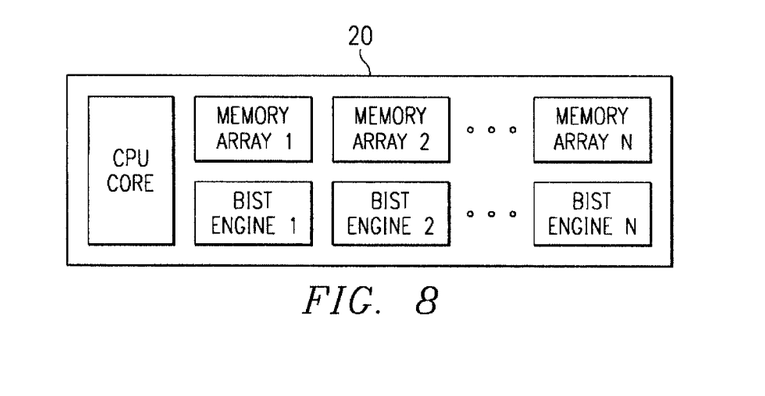
FIG. 8 illustrates a plurality of BIST engines for a chip having a plurality of memory arrays, according to the present invention.

As shown above, each BIST engine of the present invention features one BMC, one or more AGBs, and one or more DGBs. How each BIST engine is configured is entirely flexible and is a function of the manner in which the chip designer wishes to access, test, and monitor the activities of on-chip memory arrays. The distributed programming and control model described allows for the implementation to be flexible. There may be single or multiple independent BIST engines on a single integrated circuit chip; FIG. 8, for example, illustrates a microprocessor chip 20 having N BIST engines on-chip-one for each of N on-chip memory arrays or memory array groups having one or more memory arrays of the same or different sizes. Within each engine, the AGB 72 and DGB 90 may be replicated for multiple arrays of varying or equal sizes. For some arrays, the BIST engine may have separate AGB and DGB blocks for each on-chip array, or AGB and DBG blocks common to two or more on-chip memory arrays, or some combination thereof. For instance, two or more on-chip memory arrays may share a common ADG block but have separate DGB blocks unique to each memory array. In any of these schemes in which there is more than one memory array, a major advantage of the present invention is that the memory arrays may be of the same or differing sizes.

Referring to FIG. 9, several examples of BIST engine configurations are illustrated. First, the figure illustrates multiple memory arrays 1, 2, 3, 4, 5 being tested by one BIST engine comprised of the BMC, first AGB1, first DGB1, second AGB2, second DGB2, and third DGB3. Second, AGB1, DGB1, and Array 1 illustrate a separate AGB and DGB for a single on-chip memory array. Third, AGB2 illustrates an AGB having multiple ADGs, AGD2a and ADG2b, that test multiple arrays, Array 2, Array 3, Array 4, and Array 5. Fourth, ADG2b of AGB2 illustrates a single ADG shared by multiple arrays of different sizes; as can be seen, Array 4 and Array 5 are physically smaller than Array 3. DGB2 illustrates a DGB with multiple DDGs, DDG2a and DDG2b, ii that test multiple on-chip memory arrays Array 2 and Array 3. Fifth, DGB3 illustrates a single DGB shared by multiple arrays Array 4 and Array 5. Finally, in all of these examples, it is important to note that the AGBs and DGBs are physically and functionally independent from each other as shown.

Testing of a particular memory array is provided independent of any other on-chip array and the majority of other on-chip, non-BIST engine circuitry, such as CPU core logic, through the serial interface 122. The ability to independently test any particular memory array independently of the CPU core, for example, is especially useful since characterizing or accessing the array is not hindered by a non-functional or hung CPU. Thus, while the complexity and flexibility of the BIST engine of the present invention does add overhead to the chip in terms of layout area and power dissipation this investment is justified by being able to perform advanced characterization of one or more memory arrays of a VLSI chip independent of other circuitry on the chip.

The BIST engine of the present invention provides the important advantages of full access, comprehensive testing of on-chip memory arrays, and monitoring capabilities. Due to the full memory array access through the BIST engine afforded by the present invention, the BIST engine provides unprecedented flexibility in test vector generation so that large, on-chip memory arrays may be comprehensively and meaningfully tested and characterized. This flexibility is essential as critical sensitivities of the array are impossible to predict. The flexibility of the BIST engine provides for each on-chip memory array to be tested for manufacturing defects, undesirable electrical effects, and device performance with respect to voltage, temperature, process, frequency, and other testing parameters. The simple, reliable, and inexpensive serial interface 122 to the BMC supports this flexibility. Full access to the memory arrays reduces test time requirements.

While the invention has been particularly shown and described with reference to a preferred embodiment, it will be understood by those skilled in the art that various changes in form and detail may be made therein without departing from the spirit and scope of the invention.

What is claimed is:

1. A method of testing and monitoring arrays on an integrated circuit chip having a built-in-self-test (BIST) engine comprising one or more address generation blocks capable of being programmed with an address generation program, one or more data generation blocks capable of being programmed with a data generation program, and a main control block, said method comprising:
   a) dynamically programming the one or more address generation blocks of the built-in-self-test (BIST) engine with the address generation program to selectively provide address information to one or more on-chip memory arrays;
   b) dynamically programming the one or more data generation blocks of the BIST engine with the data generation program to selectively provide and receive data information to and from the one or more on-chip memory arrays; and
   c) dynamically programming the main control block of the BIST engine to coordinate when the one or more address generation blocks execute the address generation program and when the one or more data generation blocks execute the data generation program.

2. The method of claim 1, wherein programming the one or more address generation blocks is accomplished by programming an address control register of an address local control block of the one or more address generation blocks to define operation of one or more address-data blocks of the one or more address generation blocks.

3. The method of claim 2, wherein programming the address control register is accomplished by providing instructions to an address staging register that is coupled to the address control register.

4. The method of claim 2, further comprising:
   programming a mode field of the address control register to set a mode that controls operations of the one or more address-data blocks.

5. The method of claim 4, wherein in response to the mode set by the programmed mode field, generating the address information provided to the one or more on-chip memory arrays by an address-data register of a plurality of address-data registers controlled by the address control register.

6. The method of claim 4, wherein in response to the mode set by the programmed mode field, generating the address information provided to the one or more on-chip memory arrays by a first address-data register and a second address-data register of a plurality of address-data registers controlled by the address control register.

7. The method of claim 4, wherein in response to the mode set by the programmed mode field, generating the address information provided to the one or more on-chip memory arrays by looping through a plurality of address-data registers controlled by the address control register.

8. The method of claim 4, wherein in response to the mode set by the programmed mode field, recording the address information by at least one address-data register of a plurality of address-data registers.

9. The method of claim 8, wherein the address information is recorded by a multiple-input-shift-register (MISR) of the at least one address-data register that is capable of performing a signature analysis of the address information.

10. The method of claim 8, wherein the address information recorded by the at least one address-data register is provided to the one or more address generation blocks.

11. The method of claim 2, further comprising:
   programming the address control register to disable one or more special-purpose address-data registers of a plurality of address-data registers of the one or more address-data blocks.

12. The method of claim 11, wherein disabling the one or more special-purpose address-data registers causes the one or more special-purpose address-data register to operate as general-purpose address-data registers.

13. The method of claim 2, further comprising:
   programming the address control register to selectively update one or more special-purpose address-data registers of a plurality of address-data registers of the one or more address-data blocks and when to selectively update the one or more special-purpose address-data registers.

14. The method of claim 1, wherein programming the one or more data generation blocks is accomplished by programming a data control register of a data local control block of the one or more data generation blocks to define operation of one or more data-data blocks of the one or more data generation blocks.

15. The method of claim 14, wherein programming the data control register is accomplished by providing instructions to a data staging register that is coupled to the data control register.

16. The method of claim 14, further comprising:
programming a mode field of the data control register to set a mode that controls operations of the one or more data-data blocks.

17. The method of claim 16, wherein in response to the mode set by the programmed mode field, generating the data information provided to the one or more on-chip memory arrays by an data-data register of a plurality of data-data registers controlled by the data control register.

18. The method of claim 16, wherein in response to the mode set by the programmed mode field, generating the data information by a first data-data register and a second data-data register of a plurality of data-data registers controlled by the data control register.

19. The method of claim 16, wherein in response to the mode set by the programmed mode field, generating the data information by looping through a plurality of data-data registers.

20. The method of claim 16, wherein in response to the mode set by the programmed mode field, recording data information read from or written to the one or more on-chip memory arrays to one or more data-data registers of a plurality of data-data registers.

21. The method of claim 20, wherein the data information read from or written to the one or more on-chip memory arrays is recorded by a multiple-input-shift-register (MISR) of the plurality of data-data registers that is capable of performing a signature analysis of the data information.

22. The method of claim 20, wherein the data information recorded by the one or more data-data registers is provided to the one or more data generation blocks.

23. The method of claim 16, wherein in response to the mode set by the programmed mode field, writing data information to the one or more on-chip memory arrays and storing data information read from the one or more on-chip memory arrays.

24. The method of claim 14, further comprising:
programming the data control register to disable one or more special-purpose data-data registers of a plurality of data-data registers of the one or more data-data blocks.

25. The method of claim 24, wherein disabling the one or more special-purpose data-data registers causes the one or more special-purpose data-data registers to operate as general-purpose data-data registers.

26. The method of claim 14, further comprising: programming the data control register to selectively update one or more special-purpose data-data registers of a plurality of data-data registers of the one or more data-data blocks and when to selectively update the one or more special-purpose data-data registers.

27. The method of claim 1, wherein the address information provided to the one or more on-chip memory arrays by the one or more address generation blocks is provided to the one or more address generation blocks by the CPU coupled to the BIST engine or by one or more address-data blocks of the one or more address generation blocks.

28. The method of claim 1, wherein the data information provided to the one or more on-chip memory arrays by the one or more data generation blocks is provided to the one or more data generation blocks by the CPU coupled to the BIST engine or by one or more data-data blocks of the one or more data generation blocks.

29. The method of claim 1, wherein the step of programming the one or more data generation blocks of the BIST engine may be performed prior to programming the one or more address generation blocks.

30. The method of claim 1, further comprising:
performing a signature analysis of the address information provided to the one or more on-chip memory arrays.

31. The method of claim 30, wherein performing the signature analysis of the address information is accomplished by a special-function register of the address generation block that monitors the address information and is controlled by an address local control block of the address generation block to record and compress the address information over a period of time into a signature.

32. The method of claim 31, wherein the special-function register is a multiple-input-shift-register (MISR).

33. The method of claim 1, further comprising,
performing a signature analysis of the data information provided to or obtained from the one or more on-chip memory arrays.

34. The method of claim 33, wherein performing the signature analysis of the data information is accomplished by a special-function register of the data generation block that monitors the data information and is controlled by a data local control block of the data generation block to record and compress the data information over a period of time into a signature.

35. The method of claim 34, wherein the special-function register is a multiple-input-shift-register (MISR).

36. The method of claim 1, wherein programming the main control block is accomplished by programming a main control register of the main control block.

37. The method of claim 36, wherein the main control register is programmed by instructions provided to a main staging register.

38. The method of claim 36, wherein the main control block is initialized when an instruction is stored in the main control register.

39. The method of claim 1, wherein the main control block is programmed to ensure that the BIST engine operates synchronously with non-BIST engine circuitry of the integrated circuit chip.

40. The method of claim 39, wherein the non-BIST engine circuitry is a central processing unit (CPU) of the integrated circuit chip.

41. The method of claim 1, wherein the main control block is programmed to ensure that the BIST engine operates independently of non-BIST engine circuitry of the integrated circuit chip.

42. The method of claim 41, wherein the non-BIST engine circuitry is a central processing unit (CPU) of the integrated circuit chip.

43. The method of claim 1, wherein the main control block is programmed over a dedicated interface.

44. A BIST engine that is capable of accessing, testing and monitoring on-chip arrays of an integrated circuit device, comprising:
a main control block;
one or more programmable address generation blocks controlled by the main control block to selectively provide address information to one or more on-chip memory arrays, comprising:
an address local control block having an address control register; and
one or more address-data blocks having a plurality of address-data registers control led by the address control register to provide or monitor address information from either the one or more address generation block or a CPU of the integrated circuit device to one or more on-chip memory arrays to which the one or more address-data generation blocks are coupled in accordance with instructions programmed into the address control register; and one or more programmable data generation blocks controlled by the main control block to selectively provide and receive data information to and from the one or more on-chip memory arrays, comprising:

a data local control block having a data control register; and one or more data-data blocks having a plurality of data-data registers controlled by the data control register of the data local control block to provide or monitor data information from either the one or more data generation block or the CPU of the integrated circuit device to the one or more on-chip memory arrays to which the one or more data-data blocks are coupled in accordance with instructions programmed into the data control register and to receive information from the one or more on-chip memory arrays, wherein the main control block is programmed by programming a main control register of the main control block to coordinate when the one or more address generation blocks and the one or more data generation blocks execute their programming.

45. The BIST engine of claim 44, wherein the pluality of address-data registers compries one or more general-purpose address registers and one or more special-purpose address registers.

46. The BIST engine of claim 45, wherein the one or more special-purpose address registers are capable of being selectively disabled by the address local control block to function as general-purpose address registers.

47. The BIST engine of claim 45, wherein a special-purpose address register that monitors the address information provided to the one or more on-chip memory arrays is capable of performing a signature analysis of the address information and is controlled by the address local control block to record and compress the address information over a period of time into a signature.

48. The BIST engine of claim 47, wherein the special-function register is a multiple-input-shift-register (MISR).

49. The BIST engine of claim 44, wherein the plurality of address-data registers are each at least as wide as the address of the one or more on-chip memory arrays to which said address-data register is coupled.

50. The BIST engine of claim 44, wherein a mode field of the address control register is programmed to set a mode of the one or more address generation blocks that control operations of the one or more address-data blocks.

51. The BIST engine of claim 50, wherein the mode set by the mode field causes an address-data register of a plurality of address-data registers controlled by the address control register to generate the address information provided to the one or more on-chip memory arrays.

52. The BIST engine of claim 50, wherein the mode set by the mode field causes a first address-data register and a second address-data register of a plurality of address-data registers controlled by the address control register to generate the address information provided to the one or more on-chip memory arrays.

53. The BIST engine of claim 50, wherein the mode set by the mode field causes a plurality of address-data registers controlled by the address control register to generate the address information by looping through the plurality of address-data registers.

54. The BIST engine of claim 50, wherein the mode set by the mode field causes the address information to be recorded by at least one address-data register of a plurality of address-data registers of the one or more address-data block.

55. The BIST engine of claim 54, wherein the address information is recorded by a multiple-input-shift-register (MISR) of the at least one address-data register that is capable of performing a signature analysis of the address information provided by the CPU.

56. The BIST engine of claim 44 wherein one or more control fields of the address control register are programmed to disable one or more special-purpose address-data registers of the plurality of address-data registers.

57. The BIST engine of claim 56, wherein the disabled one or more special-purpose address-data registers operate as general-purpose address-data registers.

58. The BIST engine of claim 44, wherein one or more control fields of the address control register are programmed to selectively update one or more special-purpose address-data registers of the plurality of address-data registers and to control when the one or more special-purpose address-data registers are selectively updated.

59. The BIST engine of claim 44, wherein the plurality of data-data registers comprises one or more general-purpose data registers and one or more special-purpose data registers.

60. The BIST engine of claim 59, wherein the one or more special-purpose data registers are capable of being selectively disabled by the data local control block to function as general-purpose data registers.

61. The BIST engine of claim 59, wherein a special-purpose data register that monitors the data information provided to the one or more on-chip memory arrays or received from the one or more on-chip memory arrays is capable of performing a signature analysis of the data information and is controlled by the data local control block to record and compress the data information over a period of time into a signature.

62. The BIST engine of claim 61, wherein the special-function data register is a multiple-input-shift-register (MISR).

63. The BIST engine of claim 59, wherein each data-data block of the one or more data-data blocks further comprises:

a comparison element coupled to the plurality of data-data registers that compares data read from the one or more on-chip memory arrays and data stored in a special-purpose data register to produce a comparison result that is provided to the plurality of data-data registers.

64. The BIST engine of claim 44, wherein the plurality of data-data registers are each at least as wide as the data of the one or more on-chip memory arrays to which said data-data register is coupled.

65. The BIST engine of claim 44, wherein a mode field of the data control register is programmed to set a mode of the one or more data generation blocks that control operations of the one or more data-data blocks.

66. The BIST engine of claim 65, wherein the mode set by the mode field causes a data-data register of a plurality of data-data registers controlled by the data control register to generate the data information provided to the one or more on-chip memory arrays.

67. The BIST engine of claim 65, wherein the mode set by the mode field causes a first data-data register and a second data-data register of a plurality of data-data registers controlled by the data control register to generate the data information provided to the one or more on-chip memory arrays.

68. The BIST engine of claim 65, wherein the mode set by the mode field causes a plurality of data-data registers controlled by the data control register to generate the data information by looping through the plurality of data-data registers.

69. The BIST engine of claim 65, wherein the mode set by the mode field causes data information read from or written to the one or more on-chip memory arrays to be recorded by one or more data-data registers of the plurality of data-data registers.

70. The BIST engine of claim 69, wherein the data information read from or written to the one or more on-chip memory arrays is recorded by a multiple-input-shift-register (MISR) of the plurality of data-data registers that is capable of performing a signature analysis of the data information.

71. The BIST engine of claim 65, wherein the mode set by the mode field causes the plurality of data-data registers to write data information to the one or more on-chip memory arrays and store data information read from the one or more on-chip memory arrays.

72. The BIST engine of claim 44, wherein one or more control fields of the data control register are programmed to disable one or more special-purpose data-data registers of the plurality of data-data registers.

73. The BIST engine of claim 72, wherein the disabled one or more special-purpose data-data registers operate as general-purpose data-data registers.

74. The BIST engine of claim 44, wherein one or more control fields of the data control register are programmed to selectively update one or more special-purpose data-data registers of the plurality of data-data registers and to control when the one or more special-purpose data-data registers are selectively updated and to control when the one or more special-purpose data-data registers are selectively updated.

75. The BIST engine of claim 44, wherein the programming of the main control block is initiated when an instruction is stored into the main control register.

76. The BIST engine of claim 44, wherein the main control register is programmed by instructions provided to a main staging register of the main control block.

77. The BIST engine of claim 44, wherein the main control register comprises:
  a data field;
  a control field that controls the address local control block and the data local control block; and
  an instruction field that provides instructions to the one or more address generation blocks and the one or more data generation blocks.

78. The BIST engine of claim 77, wherein the control field contains a control bit to selectively enable a signature update performed by a special-purpose register of the one or more address-data blocks or of the one or more data-data blocks.

79. The BIST engine of claim 77, wherein the control field contains a control bit to selectively control when an update operations of a special-purpose register of the one or more address-data blocks or of the one or more data-data blocks is performed.

80. The BIST engine of claim 77, wherein the control field contains a control bit to stop operation of the BIST engine in the event of a parity error.

81. The BIST engine of claim 77, wherein the instruction field provides an instruction that instructs the one or more address generation blocks and the one or more data generation blocks to execute their programming for a predetermined number of clock cycles.

82. The BIST engine of claim 81, wherein the instruction field provides an instruction that instructs the one or more address generation blocks and the one or more data generation blocks to execute their programming for a predetermined number of clock cycles and then cause one or more special-purpose registers of the BIST engine to perform an update signature analysis.

83. The BIST engine of claim 44, wherein the one or more memory arrays are of different sizes.

84. The BIST engine of claim 44, wherein the main control block is programmed to ensure that the BIST engine operates synchronously with non-BIST engine circuitry of the integrated circuit chip.

85. The BIST engine of claim 84, wherein the non-BIST engine circuitry is a central processing unit (CPU) of the integrated circuit chip.

86. The BIST engine of claim 44, wherein the main control block is programmed to ensure that the BIST engine operates independently of non-BIST engine circuitry of the integrated circuit chip.

87. The BIST of claim 86, wherein the non-BIST engine circuitry is a central processing unit (CPU) of the integrated circuit chip.

88. The BIST engine of claim 44, wherein the main control block is programmed over a dedicated interface.

89. The method of claim 88, wherein the dedicated interface is a serial interface.

90. The method of claim 89, wherein the dedicated interface is a JTAG TAP serial interface.

91. The method of claim 88, wherein the dedicated interface is a parallel interface.

92. The BIST engine of claim 44, wherein the BIST engine further comprises one or more read/write registers with each read/write register of the one or more read/write registers containing a plurality of read/write bits, with each read/write bit of the plurality of read/write bits determining whether a read operation or a write operation to the one or more on-chip memory arrays is to be performed when that read/write bit is referenced.

* * * * *

UNITED STATES PATENT AND TRADEMARK OFFICE
CERTIFICATE OF CORRECTION

PATENT NO. : 6,321,320 B1
DATED : November 20, 2001
INVENTOR(S) : Fleischman et al.

It is certified that error appears in the above-identified patent and that said Letters Patent is hereby corrected as shown below:

Column 14,
Line 62, delete "control led" and insert therefor -- controlled --

Signed and Sealed this

Nineteenth Day of August, 2003

JAMES E. ROGAN
*Director of the United States Patent and Trademark Office*